United States Patent [19]

Miller et al.

[11] Patent Number: 5,536,666
[45] Date of Patent: Jul. 16, 1996

[54] METHOD FOR FABRICATING A PLANAR ION-IMPLANTED GAAS MESFET WITH IMPROVED OPEN-CHANNEL BURNOUT CHARACTERISTICS

[75] Inventors: Dain C. Miller; Robert A. Sadler; Andrew H. Peake, all of Roanoke, Va.

[73] Assignee: ITT Corporation, New York, N.Y.

[21] Appl. No.: 405,174

[22] Filed: Mar. 16, 1995

Related U.S. Application Data

[62] Division of Ser. No. 385,079, Feb. 7, 1995, which is a continuation of Ser. No. 253,723, Jun. 3, 1994, abandoned.

[51] Int. Cl.⁶ .................................................. H01L 21/265
[52] U.S. Cl. ........................... 437/41; 437/44; 437/40; 437/912; 437/154; 437/133
[58] Field of Search ........................... 437/41 AS, 44, 437/22, 36, 176, 912, 154, 41 SH, 40 AS, 40 SH, 126, 133, 41, 40

[56] References Cited

U.S. PATENT DOCUMENTS

| | | | |
|---|---|---|---|
| 4,956,308 | 9/1990 | Griffin et al. | 437/41 |
| 4,992,387 | 2/1991 | Tamura | 437/40 AS |
| 5,336,627 | 8/1994 | Pacou et al. | 437/912 |
| 5,344,788 | 9/1994 | Noda | 437/41 |

FOREIGN PATENT DOCUMENTS

| | | | |
|---|---|---|---|
| 0212474 | 8/1989 | Japan | 437/40 SH |

*Primary Examiner*—Tuan H. Nguyen
*Attorney, Agent, or Firm*—Plevy & Associates; Patrick M. Hogan

[57] ABSTRACT

An improved substantially planar and easy to manufacture field-effect-transistor (FET) includes a guard region between an n+ drain region and the remainder of the device, which enables the breakdown voltage of the FET to be substantially increased under open-channel conditions without adversely impacting other important device characteristics.

6 Claims, 3 Drawing Sheets

METHOD FOR FABRICATING A PLANAR ION-IMPLANTED GAAS MESFET WITH IMPROVED OPEN-CHANNEL BURNOUT CHARACTERISTICS

This is a Divisional, of application Ser. No. 08/385,079, filed Feb. 7, 1995 which is a Continuation of application Ser. No. 08/253,723 filed on Jun. 3, 1994, now abandoned.

FIELD OF THE INVENTION

The present invention relates to an improved field effect transistor (FET) device and its fabrication. More particularly, the invention relates to an FET with substantially improved burn-out characteristics that is easy to manufacture.

BACKGROUND OF THE INVENTION

GaAs MESFETs (MEtal-Semiconductor Field Effect Transistors) are well established as microwave power devices at medium power levels. The amount of output power which can be produced by a given device is determined by the product of the maximum current the device can conduct and the maximum voltage the device can tolerate from drain to source without burning out. Because of other considerations including ohmic losses in the device and circuit which are proportional to the square of the device current, it is attractive to use larger supply voltages and less current to achieve a given power level. However, the supply voltage must be set low enough so that the maximum voltage present across the drain and source electrodes of the device is less than its burnout voltage by an acceptable margin.

In a typical power application, the active device operates with a "load line", implying that the maximum voltage appearing across the device decreases as the current through it increases. Accordingly, one may infer that a device with a lower burnout voltage under open-channel (high current) conditions than that under pinched off (low current) conditions is acceptable. However, a device with high burnout voltage at all current levels is desirable so that temporary transients or mismatch conditions will not make the device fail. For example, when the input and output impedance matching structures of a GaAs FET amplifier are empirically tuned to optimize amplifier performance, high mismatches in load impedances often occur. With a high mismatch, the microwave power being generated by the FET is not delivered to the load but instead, a high current flows across the FET. High mismatches also occur when other components or solder connections in an amplifier circuit fail, resulting in the high current condition. Abnormally high voltage and current conditions can also arise due to switching transients across inductive loads. Thus, meeting the objective of providing a high burnout voltage at all current levels was one factor which guided GaAs MESFET development historically.

Early GaAs MESFETs were "planar" devices, meaning that all three of the device electrodes—source, gate, and drain—were fabricated on one surface of the GaAs material. These devices could be made by a relatively simple fabrication process which was attractive for its low cost and ease of manufacturing. By the mid 1970's, it was found that adding inlaid n+ source and drain contact regions to such a planar device could increase the device's drain-source burnout voltage as well as decrease the device's parasitic resistances. Subsequently, it was found that such devices suffered from a serious limitation—the drain burnout voltage was much lower under open-channel conditions than it was when the device was pinched off. FIG. 1 shows a cross-sectional diagram of a such a planar prior art MESFET having inlaid n+ regions beneath its source and drain electrodes. Reference numeral 12 indicates the channel region, which is the region where avalanche breakdown has been assumed to occur historically. The region denoted by reference number 13, i.e., the area within the subchannel region 14 that adjoins the drain n+ region and is beneath the channel region 12, is another possible site for avalanche breakdown.

U.S. Pat. No. 4,956,308 discloses a method of making self-aligned field effect transistors having asymmetrical structures as opposed to forming symmetrical drain and source n+ regions on respective sides of the gate electrode. The inclusion of this asymmetrical structure results in lower parasitic source resistance without impacting other critical device parameters. However, this technique does not afford improved open-channel burn-out performance—only pinched-off burnout performance is improved.

Further improvement in burnout near pinch-off was obtained by forming the gate at the bottom of an etched trough or recess in the GaAs channel region which had the same lateral dimension as the gate. However, the open-channel burnout was not affected much by this modification. It was then discovered that the open-channel burnout voltage could be increased by using a wide recess (wider than the gate, as shown in FIG. 2).

Most modern GaAs power MESFETs are similar to FIG. 2. The gate recess (or multiple gate recesses) allow the burnout characteristics to be very good, but the resulting recessed-gate device is not as easy to manufacture as a planar device. On the other hand, conventional planar devices as exemplified by FIG. 1., which are desirable from a manufacturing standpoint, have the undesirable open-channel burnout characteristics.

It is therefore an object of the present invention to provide a field-effect transistor which overcomes the disadvantages of the prior art.

It is an additional object of the present invention to provide an enhanced planar MESFET having highly improved open-channel burnout characteristics and which preserves the manufacturing advantages of a planar device.

It is another object of the present invention to provide a device structure in which a selectively doped guard region is present between the drain n+ region and the remainder of the device.

It is yet another object of the present invention to provide a method of producing field-effect transistors in which the open-channel burnout voltage is increased without an adverse effect on the device's microwave performance characteristics.

SUMMARY OF THE INVENTION

An improved substantially planar and easy to manufacture field-effect transistor includes a guard region, in proximity to a drain region, which allows the breakdown voltage of the FET to be significantly increased under open-channel conditions without adversely impacting other device performance characteristics.

The guard region may have a carrier concentration in between the carrier concentrations of the drain region and a subchannel region. A substrate such as GaAs incorporates the subchannel region, and a channel region is disposed on the subchannel. The drain region and a source region, both preferably n-type, are disposed on respective sides of the channel. Substantially planar source, drain and gate electrodes are respectively disposed on the source, drain and channel regions.

A method of fabricating an FET with improved burn-out characteristics comprises the steps of: forming a channel region of a first active carrier concentration on a subchannel region in a substrate: forming a gate electrode on the channel region: providing a first implant mask extending laterally over the channel region having source and drain implant openings; introducing impurities of a second active carrier concentration into the substrate via the source and drain openings to form doped source and drain regions; providing a second implant mask with a third opening over the substrate wherein a portion of the drain region and/or a portion of the channel region are exposed within the third opening; introducing impurities of a third active carrier concentration via the third opening to form a guard region, wherein the guard region provides enhanced burn-out characteristics of the FET; forming respective source and drain electrodes over the source and drain regions such that the source, drain and gate electrodes are substantially planar.

The fabrication steps may be varied such as by doping the guard region before the gate electrode fabrication. Alternatively, the guard region may be doped between the gate definition and drain/source region doping steps.

DETAILED DESCRIPTION OF THE INVENTION

Figure 1:
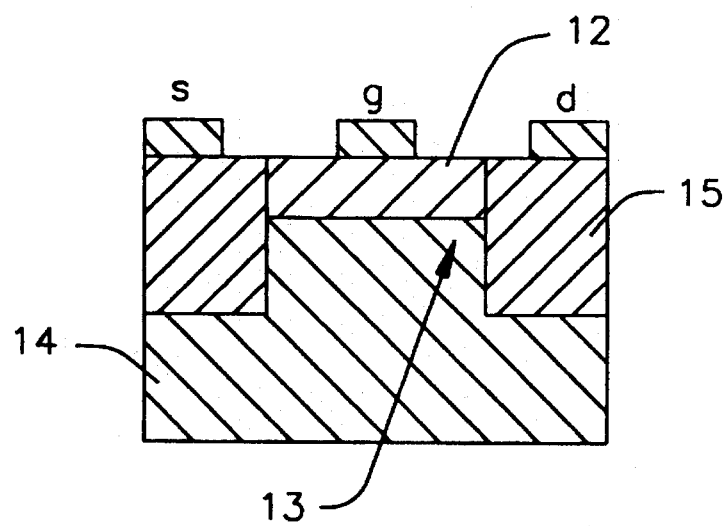
FIG. 1 depicts a cross-sectional view of a planar FET device of the prior art.
Figure 2:
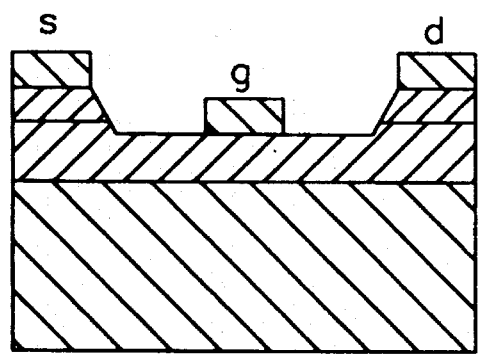
FIG. 2 shows a cross-sectional view of a prior art recessed gate FET device.

In order to clearly set forth the conceptual foundation of the present invention, reference is again made to the prior art planar device of FIG. 1. A high electric field region is induced within the current carrying channel region 12 when a large drain to source bias voltage is applied and the channel is left open—i.e., configured with external circuit components and under conditions such that a high drain to source current flows. The high electric field under these open-channel conditions is a cause of avalanche breakdown in the channel region 12. Another high electric field, induced under open-channel conditions in the area 13 adjoining the drain n+ region 15 and the subchannel region 14 beneath the channel region 12, is a cause of avalanche breakdown in the area 13.

To solve the open-channel condition avalanche breakdown problem, which is the object of the present invention, one may consider modifying the channel 12 to reduce or taper the high fields therein. However, since the channel 12 is the current carrying channel, any such modifications would be difficult without adversely affecting the other critical device parameters such as transconductance and current linearity. On the other hand, modifying the region 13 would reduce open-channel avalanche breakdown with minimal effect on the other critical parameters.

In a typical planar device, a large difference in doping exists between the drain n+ region 15 and the subchannel region 14. The subchannel 14 is often comprised of undoped GaAs material. Occasionally, the subchannel 14 is intentionally doped p-type to improve pinch-off characteristics, thus forming a p-n junction between regions 15 and 14, with a very high difference in net doping. In this case, the doping gradient will be very high between the areas 13 and 15, and breakdown will occur at a relatively low voltage across the n+ to subchannel junction.

The present invention provides a solution to the prior art breakdown problem by the insertion of an intermediate level doped guard region between the n+ and subchannel regions. The impurity gradient is thereby decreased and a larger voltage is required to reach the critical value of electric field at which breakdown occurs.

Figure 3:
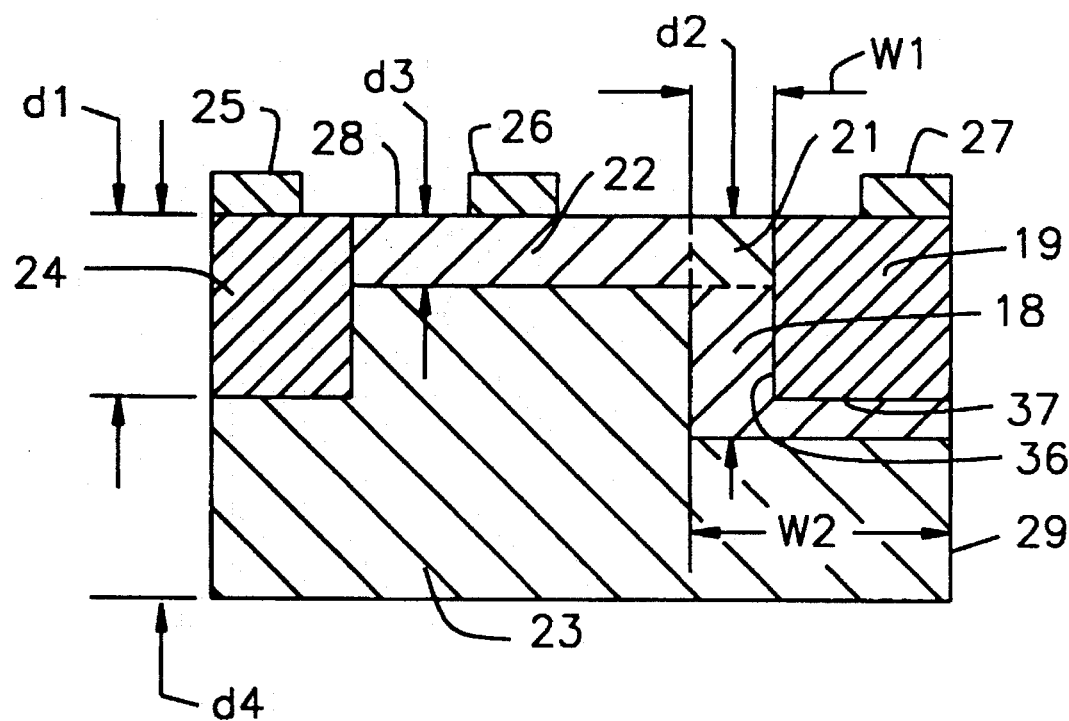
FIG. 3 shows a cross-sectional view of the preferred embodiment of an improved planar FET according to the present invention.

A cross-sectional view of the preferred embodiment of the present invention is shown in FIG. 3. A FET 30, which may be a MESFET formed from a substrate 29 such as GaAs, employs a guard region 18 between a drain n+ region 19 and the remainder of the device. An ohmic contact 25 forming the source electrode is situated above a source n+ region 24. The gate electrode is formed from Schottky contact 26, which is above a current carrying channel 22 that is preferably doped n-type. Ohmic contact 27 forms the drain electrode. As shown in FIG. 3, the gate electrode 26 is offset towards the source electrode 25. Positioning the electrodes in this asymmetrical manner is a matter of design choice, as is well known in the art. This configuration is preferred over a self-aligned gate FET having a symmetrical structure with n+ regions on either side of the gate electrode. The asymmetrical structure has the advantage of reducing the parasitic source resistance without the deleterious effects on gate-drain breakdown voltage, gate-drain capacitance and output resistance that invariably accompany a high doping level on the drain side of the gate.

An overlapping region 21 is formed between channel 22 and the guard region 18. As will be described, this overlapping region 21 is preferably of doping concentration very close to the doping concentration of the rest of the channel 22 and therefore, region 21 may be considered as pan of the channel 22 rather than as part of the guard 18. A subchannel 23 composed of GaAs material is either undoped or doped p-type, depending upon the performance characteristics objective of the design.

Guard region 18 is typically of n-, or lightly doped n, impurity concentration. The guard region 18 has a width W1 extending from a side surface of the drain n+ region 19, and a depth d2 extending from the top surface 28 of the FET 30. The preferred embodiment of FIG. 3 show the guard region 18 as having an L-shape, encompassing an area of width W1 adjacent to a side surface 36 of the drain region 19, and an area adjacent to the bottom surface 37 of the drain region 19. Width W2 of the guard region 18 beneath the drain region 19 is shown to extend all the way to the other side of region 19. Alternatively, W2 may be reduced while W1 remains the same, in which case the guard region would end at a point beneath the region 19 such as near its center or near surface 36. Thus, the doping profile of the guard region 18 may be varied along with dimensions W1, W2 and d2 to achieve a particular breakdown voltage objective. The doping concentrations of the subchannel region 23, the drain n+ region 19, and the channel region 22 are also variables which are relevant in arriving at an acceptable guard region doping gradient, and breakdown voltage. For example, an acceptable combination of carrier concentrations may be as shown in Table 1. A FET with doping profiles tailing within the ranges shown and with an Idss of about 300 mA/mm may be designed to withstand a drain to source open-channel voltage of about 25 V. Significantly, the same FET without the guard region would have a breakdown voltage or about 13 V, a factor of two lower.

TABLE 1

| REGION | ACTIVE CARRIER CONCENTRATION RANGE | DEPTH (μm) |
| --- | --- | --- |
| Channel 22 | n-type, $5 \times 10^{16} – 5 \times 10^{17}/cm^3$ | d3 = 0.2 |
| Region 21 | n-type, $5 \times 10^{16} – 5 \times 10^{17}/cm^3$ | d3 = 0.2 |
| Source Region 24 | n-type, $1 \times 10^{17} – 3 \times 10^{18}/cm^3$ | d1 = 0.3 |
| Drain Region 19 | n-type, $1 \times 10^{17} – 3 \times 10^{18}/cm^3$ | d1 = 0.3 |
| Guard Region 18 | n-type, $1 \times 10^{16} – 1 \times 10^{17}/cm^3$ | d2 = 0.4 |
| Subchannel 23 | p-type, $1 \times 10^{16} – 1 \times 10^{17}/cm^3$ | d4 = 0.6 |

Figure 4A:
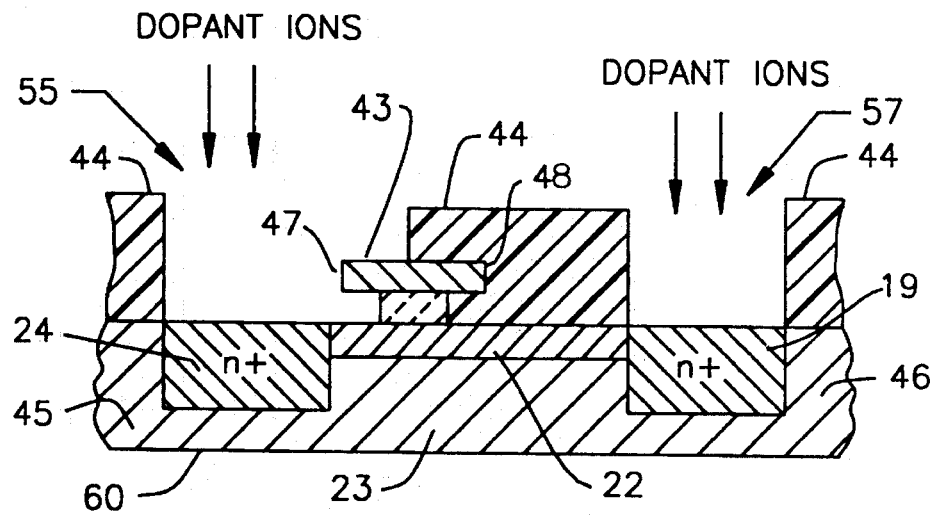
FIG. 4A illustrates a processing step used to fabricate an FET according to the invention.

Fabrication of an improved FET according to the present invention may be accomplished in several ways, based on techniques known in the art. FIGS. 4(A–C) illustrate one such fabrication process. As shown in FIG. 4A, starting with a GaAs substrate 60, existing processes are used to fabricate a doped active channel region 22, subchannel region 23, gate structure 43, and selectively doped source and drain n+ regions 24 and 19, respectively. (See for example, U.S. Pat. No. 4,956,308). The doped active channel region 22 is formed by a suitable doping method such as an ion implantation or vapor phase epitaxy. The gate metallization is patterned into a gate electrode structure 43 for the device. The preferred technique for the gate formation is to define a metal etch mask (not shown) by the method of evaporation and liftoff. A preferred etch mask material is nickel, although aluminum is also suitable for this purpose. Excess gate metal is removed by reactive ion or plasma etching, leaving gate metal only under the etch mask.

The drain n+ region 19 and source n+ region 24 are then doped by first applying and patterning photoresist or some other suitable masking material to form an implant mask 44 that extends laterally over the channel region 22. The implant mask 44 is patterned to form respective source and drain implant openings 55 and 57 through which dopant ions are implanted or diffused into the GaAs substrate 60 to form respective source and drain regions 24 and 19. FIG. 4A illustrates a source region 24 that is formed precisely by self alignment to the gate 43 in that the gate 43 serves as a mask to the dopant ions that are doping region 24. Thus, by the implant mask 44 only covering lateral edge 48 of the gate 43 and not covering lateral edge 47, the n+ source region 24 begins at the first lateral edge 47 of the gate structure 43. Moreover, the drain region 19 and respective drain electrode to be formed later, are offset from the gate electrode. This way, the aforementioned disadvantages of having a highly doped n+ region adjacent to both sides of the gate are avoided. Alternatively, the source region 24 may not be self-aligned to the gate in which case a region (not shown) between the gate 43 and the source region 24 would be masked before region 24 is ion implanted. In this case, the implant mask 44 is patterned to cover both lateral edges 47 and 48 of the gate 43 to provide drain implant opening 57 and a different source implant opening.

Figure 4B:
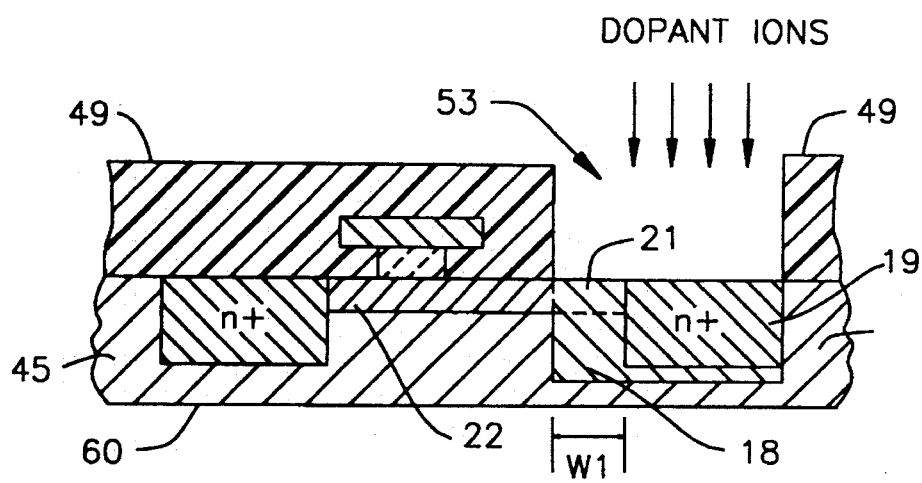
FIG. 4B illustrates an additional processing step used to fabricate an FET according to the invention.

FIG. 4B shows the formation of the guard region 18 and of overlapping region 21 using a similar masked implant or diffusion. An implant mask 49 is applied and patterned to allow dopant ions to be implanted or diffused into GaAs substrate 60 through a guard region opening 53 such that only the top surfaces of regions 21 and 19 are exposed. Dopant ions are then implanted or diffused to form the guard region 18 and overlapping region 21. The guard region 18 has a width W1 which may be 0.5–2.0 microns, and a depth d2 on the order of 0.4 microns when the drain region 19 depth d1 is about 0.3 microns. Of course, there are no precise boundaries of the doped regions inasmuch as the doping concentrations gradually taper off as a function of depth, and the doping profiles are a matter of design choice. In any event, the guard region is doped with a carrier concentration in between that of the drain n+ region and the subchannel (which may be doped p-type, lightly n-type, or undoped). Accordingly, the field strength at the drain n+ to subchannel junction is reduced, thereby preventing premature burnout related to impact ionization in this region from occurring.

It should be understood that it is not necessary for the guard region doping to be performed after the gate fabrication and selective n– doping as shown in FIGS. 4A and 4B. Rather, the guard doping could be done just as well before the gate is defined or between the gate definition and n+ doping steps.

Figure 4C:
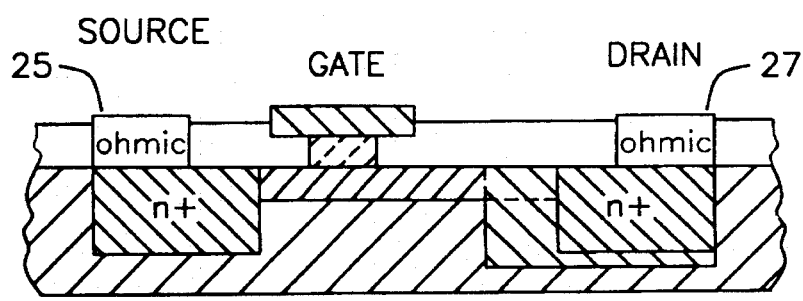
FIG. 4C shows a cross-sectional view of a completed FET according to the invention.

After the guard region 18 is formed, source and drain electrodes are formed over the source and drain regions as shown in the completed device of FIG. 4C, by use of any suitable method, as is well known in the art. It should be apparent that many variations in the details of n+ and guard activation, the final gate structure, passivation method and material, and ohmic contact materials and alloy method are possible using essentially the same guard region.

From the foregoing, disclosed is an FET having substantially planar drain, source and gate electrodes for ease of manufacture, with significantly improved burn-out characteristics. One advantage of the present invention is that a much higher breakdown voltage under open-channel (high current) conditions is obtained without adversely affecting other critical device parameters. Another advantage of this invention is that the improved FET is planar and therefore, easy to manufacture. This represents a substantial improvement over conventional high breakdown voltage FETs which have wide recesses under the gate, thereby making their manufacture a difficult process.

It should be understood that the embodiment described herein is merely exemplary and that a person skilled in the art may make many variations and modifications without departing from the spirit and scope of the invention. All such modifications are intended to be included within the scope of the invention as defined in the appended claims.

What is claimed is:

1. A method of fabricating an FET with improved burn-out characteristics, comprising the steps of:

forming a channel region of a first active carrier concentration on a subchannel region in a substrate;

forming a gate electrode on said channel region;

providing a first implant mask extending laterally over a substantial portion of said channel region not covered by said gate electrode, said first implant mask having source and drain implant openings;

introducing impurities of a second active carrier concentration into said substrate via said source and drain openings to form doped source and drain regions, providing a second implant mask with a third opening over said substrate wherein a portion of said channel region in proximity to said drain region is exposed within said third opening;

introducing impurities of a third active carrier concentration via said third opening to form a guard region, wherein said guard region provides enhanced burnout characteristics of said FET;

forming respective source and drain electrodes over said source and drain regions such that said source, drain and gate electrodes are substantially planar.

2. The method according to claim 1 wherein said substrate comprises GaAs material.

3. The method according to claim 1 wherein said gate electrode is formed with a first lateral edge and a second lateral edge, with said first lateral edge facing towards said source region and said second lateral edge facing towards said drain region, and wherein said first implant mask extends laterally over said channel region beyond said second lateral edge and is patterned to form source and drain implant openings, and wherein said first lateral edge is within said source opening such that said source region is self-aligned to said first lateral edge of said gate electrode.

4. The method according to claim 1 wherein said first active carrier concentration is n type, said second active carrier concentration is n+ type, and wherein said third active carrier concentration is in between the active carrier concentrations of said drain region and said subchannel region.

5. The method according to claim 1 wherein said impurities of said third active carrier concentration are introduced in a manner such that said formed guard region includes a region underneath said drain region.

6. The method according to claim 1 wherein said third active carrier concentration is substantially lower than said first active carrier concentration such that the carrier concentration in an overlapping region within said channel region and beneath said third opening, remains substantially the same as said first carrier concentration after said guard region is formed.

* * * * *